United States Patent [19]
Kreft et al.

[11] Patent Number: 5,442,170
[45] Date of Patent: Aug. 15, 1995

[54] PROGRAMMABLE CABLE ADAPTOR FOR CONNECTING DIFFERENT AUTOMOBILE COMPUTERS TO DIAGNOSTIC EQUIPMENT

[75] Inventors: Keith A. Kreft, Cupertino; Karl F. Heinrich, San Jose, both of Calif.

[73] Assignee: Balco, Incorporated, San Jose, Calif.

[21] Appl. No.: 228,445

[22] Filed: Apr. 15, 1994

[51] Int. Cl.⁶ .............................................. G01D 5/34
[52] U.S. Cl. ............................ 250/229; 250/227.11; 385/15; 439/638
[58] Field of Search ................................ 395/200, 295; 340/825.03; 364/424.01, 424.03; 439/638, 654, 76, 928; 324/378, 73.1; 250/229, 227.11; 385/15, 27

[56] References Cited

U.S. PATENT DOCUMENTS

| | | | |
|---|---|---|---|
| 3,714,635 | 1/1973 | Hamilton et al. | 340/172.5 |
| 4,820,172 | 4/1989 | Wolkewitz et al. | 439/76 |
| 4,897,054 | 1/1990 | Gilissen et al. | 439/631 |
| 4,956,748 | 9/1990 | Yamamoto et al. | 361/394 |
| 5,214,582 | 5/1993 | Gray | 364/424.03 |
| 5,278,759 | 1/1994 | Berra et al. | 364/424.01 |
| 5,318,449 | 1/1994 | Schoell et al. | 434/305 |

*Primary Examiner*—Edward P. Westin
*Assistant Examiner*—Steven L. Nichols
*Attorney, Agent, or Firm*—Claude A. S. Hamrick

[57] ABSTRACT

A programmable cable adaptor in accordance with the present invention includes a housing containing an internal circuit board having a plurality of conductive traces, an input connector with multiple pins or pin-receiving sockets, and an output connector with multiple pins or pin-receiving sockets. On the circuit board, there is a card edge receptacle with key-contacting pins electrically connected to the conductive traces which in turn electrically couple the receptacle pins to the input connector and/or the output connector. The key-contacting pins of the card edge receptacle are arrayed along at least one side of an elongated aperture adapted to receive an adaptor programming key generally referred to as a card edge key The "key" is typically a small printed circuit board with conductive tabs on at least one side thereof with each tab being electrically connected to at least one other tab on the key with conductive traces. When the key is inserted in the receptacle aperture, electrical connections are made between the pins/sockets of the input connector and the pins/sockets of the output connector via the tabs and circuit traces on the key. Some of the pins/sockets of the input connector may be directly connected to the pins of the output connector without going through the card edge receptacle.

26 Claims, 3 Drawing Sheets

PROGRAMMABLE CABLE ADAPTOR FOR CONNECTING DIFFERENT AUTOMOBILE COMPUTERS TO DIAGNOSTIC EQUIPMENT

BACKGROUND OF THE INVENTION

1. Field of the Invention

The present invention relates generally to cable adaptors for interfacing and configuring signal-carrying conductors linking two pieces of electrical equipment, and more specifically to a programmable adaptor using pre-configured keys to selectively configure signal paths from one connector having a first pin configuration to another connector having a second pin configuration to allow communication between two pieces of electrical equipment, such as an on-board automobile computer and a piece of diagnostic equipment.

2. Brief Description of the Prior Art

The standard in modern automobiles is to have a computer or number of computers on-board the automobile to manage and control the various systems within the vehicle. For example, through the use of an oxygen sensor in the exhaust manifold, the computer can detect how efficient the fuel is being consumed by the engine and adjust the rate of fuel injection accordingly. In addition, the computer can monitor the electrical demand and regulate the output of the alternator, etc.

In the shop, each on-board computer can be connected to a piece of diagnostic equipment via cables and connectors, and the integrity of the system can be checked to ensure that it is functioning properly. In addition, the diagnostic equipment can receive signals indicating error codes generated by the computer indicating past or presently occurring events. The diagnostic equipment can also send signals to the computer to have the computer initiate certain activity to test the various systems of the automobile.

The need for the present invention stems from the fact that although on-board computers may use the same types of plugs, jacks or other connectors used to interface with the diagnostic equipment, the pin assignments for the signals may be different from one type of computer system to another automotive vehicle or for each computer on board the vehicle. For example, a connector typically used by on-board computers is the J1962, which has 16 contactor pins within the connector for communications, voltage measurements and control functions. Different on-board computer systems may use these 16 pins differently. For example, one vehicle computer system may use pin number 5 to transmit engine data, pin number 6 to transmit transmission data, and pin number 7 to provide an external control of the EGR solenoid valve, while another vehicle computer system may use pin number 5 to transmit air bag data, pin number 6 to transmit engine data and pin 7 to provide an oxygen sensor voltage measurement. Because of the variations in the configuration of pin assignments, it is sometimes difficult or confusing to use diagnostic equipment to properly recognize and process signals.

Before the present invention, a different adaptor was usually provided for each different combination of pin configurations. The major problem with having a separate adaptor for each different pin configuration is cost. It is expensive to manufacture a set of adaptors for every model year with new pin configurations to interface with new computer systems.

One alternative solution might be to connect input signal pins to output signal pins via wires and allegator clips. But such method would be tedious, impractical, and mistake-prone. Another alternative might be to provide a multiplexer within the diagnostic equipment to configure the signal paths. The problem here is that such method increases the complexity and cost of the diagnostic equipment, since every possible combination of signal routine must be accounted for.

Although no automotive related solutions to the problems mentioned above are known, approaches remotely related to the present invention have been provided in other fields. For example, in U.S. Pat. No. 5,130,893, Straate discloses a system for distributing input signal-carrying lines to selected output lines. More particularly, he provides a signal distribution system for distributing input telephone and cable TV lines to appropriate locations in a facility. This signal distribution system is a routing scheme where a multiconductor cable, such as a telephone line, is selectively routed to multiple locations in a facility while another telephone line may be routed to other locations within or without the same facility. This system may be distinguished from the present invention because it does not reconfigure connections between the conductors of two different multiwire cables, but instead simply connects one or more input cables of a particular type to one or more output cables of the same type.

A need thus exists for an easy-to-use and low-cost apparatus to properly configure signal-conducting paths from one device to another device.

SUMMARY OF THE INVENTION

A programmable cable adaptor in accordance with the present invention includes a housing containing an internal circuit board having a plurality of conductive traces, an input connector with multiple pins or pin-receiving sockets, and an output connector with multiple pins or pin-receiving sockets. On the circuit board, there is a card edge receptacle with key-contacting pins electrically connected to the conductive traces which in turn electrically couple the receptacle pins to the input connector and/or the output connector. The key-contacting pins of the card edge receptacle are arrayed along at least one side of an elongated aperture for receiving an adaptor programming key generally referred to as a card edge key. The "key" is typically a small printed circuit board with conductive tabs on at least one side thereof with at least one tab being electrically connected to at least one other tab on the key by conductive traces. When the key is inserted into the receptacle aperture, electrical connections are made between the pins/sockets of the input connector and the pins/sockets of the output connector via the tabs and circuit traces on the key. Some of the pins/sockets of the input connector may be directly connected to the pins of the output connector without going through the card edge receptacle. These pins are usually industry standard pin assignments. In addition, some of the pins of the input connector may be connected to pins of the card edge receptacle and to the pins of the output receptacle as well. Typically, there are two such pins: one pin for voltage supply and one pin for ground.

Electrical components such as resistors, fuses, capacitors, transistors, diodes, neon lights, etc. may also be placed on the key or adaptor. For example, a resister or voltage divider can be used to drop a 10 volt signal from older computer systems to a 5 volt signal acceptable by the diagnostic equipment. It is anticipated that microprocessors might also be placed on the key and/or the adaptor circuit board as well. For example, a microprocessor may be used to multiplex incoming signals or to pre-process or pre-amplify the incoming signal for the diagnostic equipment. It is further anticipated that a small display, keypad, and/or switches could be made integral to the key and/or the adaptor housing to allow user input.

The cost of manufacturing a key is considerably lower than the cost of manufacturing an adaptor. Whenever there is a new configuration of pin assignments for new models of automobiles, only new keys need be made, not a whole adaptor. And such keys can be easily and quickly distributed to diagnostic equipment owners.

Although a programmable cable adaptor suitable for use in the automotive industry is disclosed, it is anticipated that the adaptor can be modified to meet similar requirements in other fields as well, such as the computer field for instance.

These and other objects and advantages of the present invention will no doubt become apparent to those skilled in the art after having read the following detailed description of the preferred embodiment which is illustrated in the several figures of the drawing.

DETAILED DESCRIPTION OF THE PREFERRED EMBODIMENT

In general, the present invention provides an adaptor module with an input connector to receive input signals from a device, in this case an on-board computer in an automobile, and properly configures the signal paths to an output connector for connection to another device, in this case a piece of diagnostic equipment. The configuration of at least some of the signal paths between connectors is achieved through the use of a card-edge-type connector which causes electrical interconnections to be made when a card-edge printed circuit board ("key") with edge tabs connected by trace routes is inserted into the connector.

Figure 1:
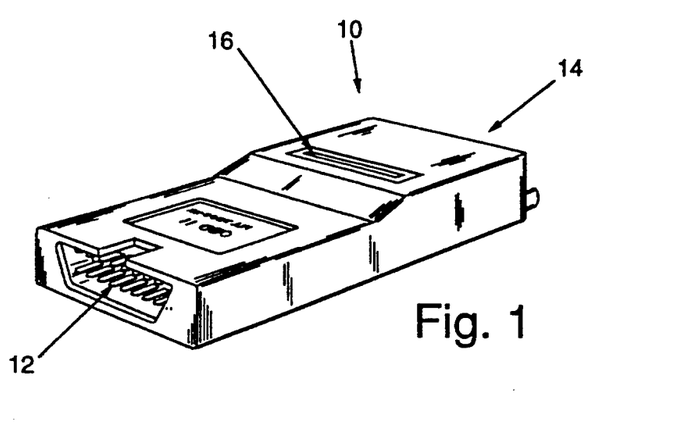
FIG. 1 is a perspective view showing the input end connector of a programmable cable adaptor in accordance with the present invention.

In FIG. 1, a programmable cable adaptor is shown to include a housing 10, an input connector 12 on one end, an output connector 14 on the other end, and a slotted opening 16 on top of the housing. In this embodiment, the connector 12 accepts ODB-II connectors that follow J-1962 specifications.

Figure 2:
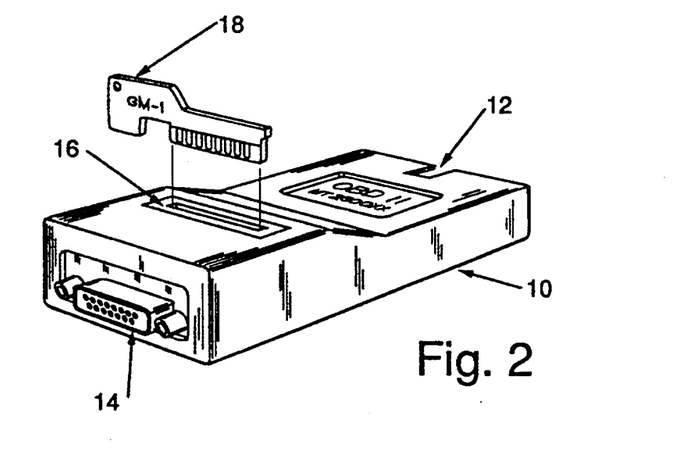
FIG. 2 is a perspective view showing the output end connector of the programmable cable adaptor of FIG. 1 together with a key which can be used to configure the adaptor to meet certain connection requirements.

FIG. 2 illustrates the opposite end of the adaptor showing the output connector 14, and the opening 16 with a "programming" key 18 exploded therefrom. In this example, the connector 14 is a DB15 type 15-pin connector.

Figure 3:
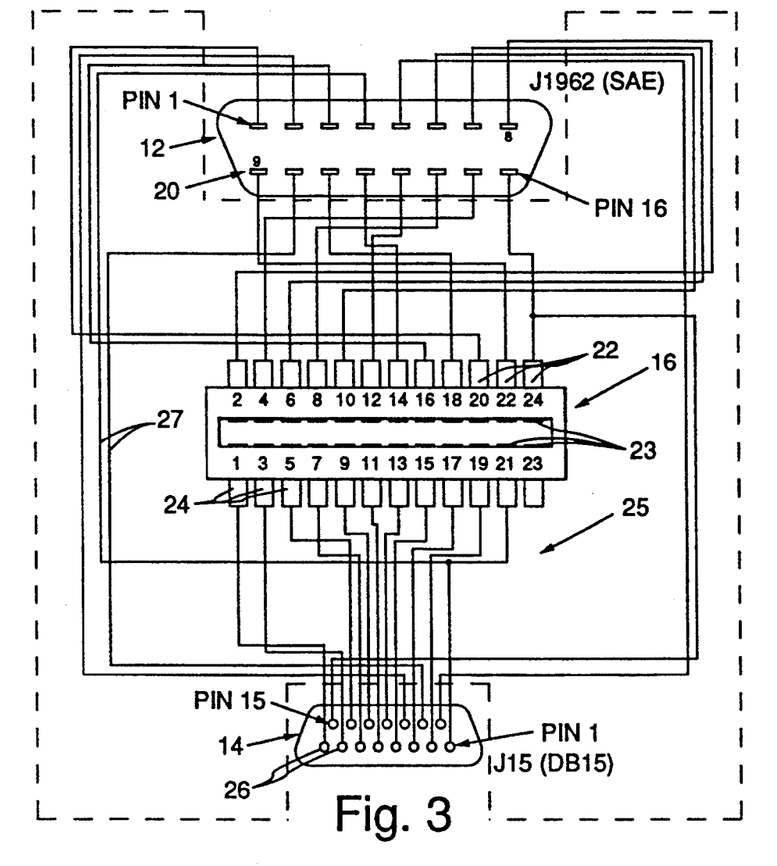
FIG. 3 is a schematic diagram showing the internal circuitry of a programmable cable adaptor in accordance with the present invention.

Referring now to FIG. 3, which is intended to illustrate the internal interconnections between the several connectors, the card edge connector 16 is shown to have twelve pins 20 on one side, which are connected by traces 19, formed on a circuit board suggested by the dashed lines 17, to the pins 22 of the input connector 12. Similarly, twelve pins 24 on the opposite side of connector 16 are connected by circuit board traces 25 to the pin receptacles 26 of the output connector 14. The connectors 12 and 14 are also attached to the circuit board 17. Optionally, some of the pins of the input connector 12 may be connected by circuit board traces 27 directly to the pins of the output connector 14 or to both the pins of the output connector 14 and to pins on the other side of card edge connector 16. The card contacting surfaces 23 of the pins 22 and 24 of the edge connector may be simple conductive bumps, leaf spring contacts, spring-loaded pins or other suitable means. Furthermore, instead of using circuit board traces, discrete wires or ribbon cable conductors could be used to interconnect the general connectors.

Figure 4:
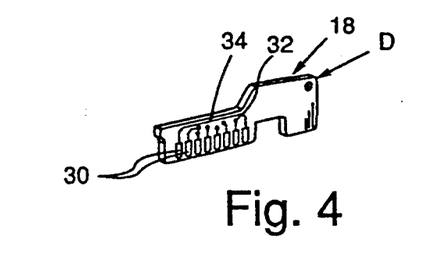
FIG. 4 shows a card edge printed circuit board also referred to herein as a key.

Referring now to FIG. 4, a key 18 is depicted having at least one conductive tab 30 electrically linked to at least one other tab via holes 32 and/or trace routes 34. The preferred embodiment has tabs on both sides of the key. The key and its connecting conductors and contacts can take any suitable form.

Figure 5:
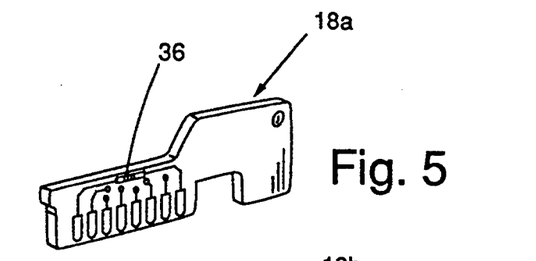
FIG. 5 shows an alternative embodiment of the key with a resistor on-board.

FIG. 5 shows a different embodiment of the key 18 with a resistor 36 connected between two of the tabs. The resistor might serve to provide a voltage drop of the signal between the input connector and output connector. The resistor or pair of resistors might also serve as a means of identifying to the test equipment which specific key has been inserted into the receptacle 16. Other electrical components such as capacitors, inductors, filters, diodes, etc. could likewise be included in the key 18.

Figure 6:
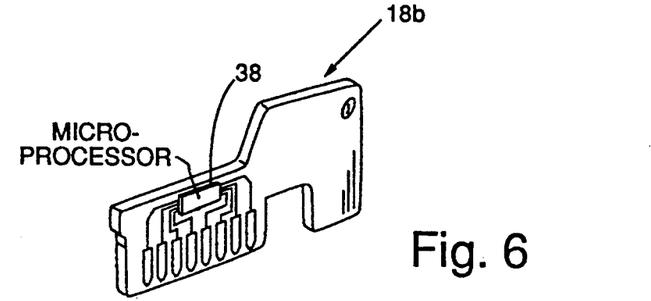
FIG. 6 shows another embodiment of the key with a microprocessor on-board.

FIG. 6 shows still another embodiment of the key 18 having a microprocessor on-board. It is anticipated that a microprocessor 38 could be used to provide a variety of processing functions before the signal is passed between the devices. For example, a simple microprocessor could be used to multiplex the various input or output signals. It is further anticipated that a wired or wireless remote display and/or keypad along with the microprocessor may be included as part of the key and/or housing to allow user control of the signal or signaling function.

The input connector and the output connector of the present invention may be of any configuration having any number of pins/sockets. For example, in FIG. 3, the input connector has 16 flat pins and the output connector has 15 sockets, but any other suitable connector could be used. Not all of the pins/sockets need be used, and there may be more than one key for a particular computer system to test different systems on-board.

By inserting a key into the adaptor, the desired electrical connections are made between the pins/sockets of the input connector and the pins/sockets of the output connector via the tabs on the key. By inserting a key with a different set of conductive trace routes or connections between the tabs, the adaptor may be configured to connect different pins/sockets of the input connector to the pins/sockets of the output connector.

Figure 7:
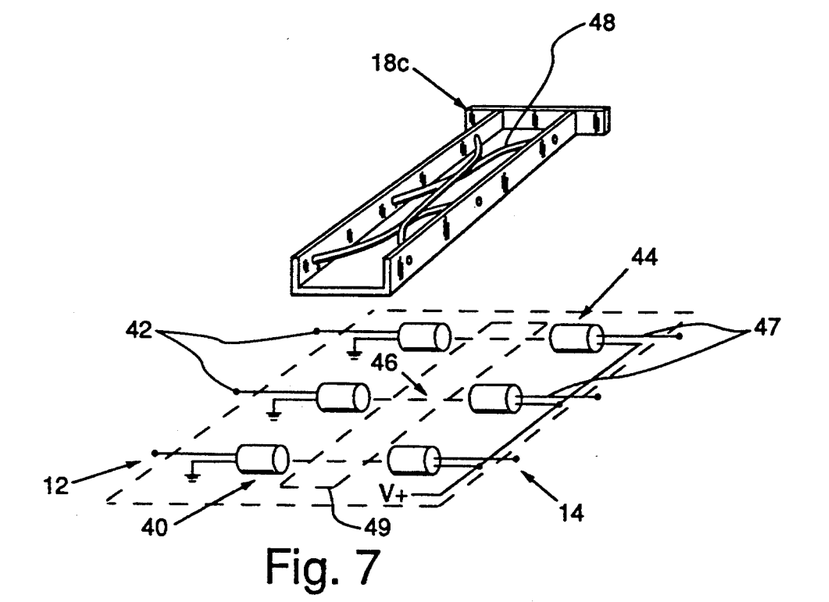
FIG. 7 illustrates still another embodiment of a connector assembly in accordance with the present invention.

An alternative form of key and signal connection means is illustrated in FIG. 7 wherein instead of using metallic contacts and key tabs to selectively connect signal paths, coupling means in the form of a set of diode light sources (LEDs) 40 are shown disposed on one side of the key-receiving slot 46 and are connected to the pins/sockets 42 of the input connector 12. Coupling means in the form of a set of light sensors 44 are disposed on the opposite side of slot 46, perhaps in alignment with the sources 40, and the outputs thereof are connected to the pins/sockets 47 of the output connector 14. An opaque key 18c, having fiberoptics or other optical connectors 48 appropriately routed, will optically link at least some of the light sources 40 to some of the light detectors 44 and thus couple one signal path to another when inserted into the light paths and located in the position indicated by the dashed lines 49. This embodiment has the added feature that the input connector 12 will be electrically isolated from the output connector 14.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

I claim:
1. A programmable cable adaptor comprising:
   an input connector means having a plurality of input pins/sockets;
   an output connector means having a plurality of output pins/sockets;
   key receptacle means having a key-receiving aperture and a first plurality of coupling means disposed along at least one side of said aperture and electrically connected to at least some of said input pins/sockets, and a second plurality of coupling means disposed along at least one side of said aperture and connected to at least some of said output pins/sockets; and
   key means having a plurality of discrete communicating elements configured to link selected ones of said first coupling means to selected ones of said second coupling means such that selected output pins/sockets are communicatively connected to selected input pins/sockets when said key means is disposed within said aperture.

2. A programmable cable adaptor as recited in claim 1 wherein some of said input pins/sockets are directly connected to some of said output pins/sockets.

3. A programmable cable adaptor as recited in claim 1 wherein some of said input pins/sockets are directly connected to some of said output pins/sockets and to some of said coupling means.

4. A programmable cable adaptor as recited in claim 1 wherein some of said input pins/sockets are connected to other input pins/sockets and some of said output pins/sockets are connected to other output pins/sockets.

5. A programmable cable adaptor as recited in claim 1 wherein said key means includes means for enabling an electronic system connected to said adaptor to determine the key type thereof.

6. A programmable cable adaptor as recited in claim 1 wherein said first and second coupling means include electrical contacts, and wherein said key means includes a plurality of conductive tabs disposed along both sides of a programming card with particular ones of said tabs electrically connected to other ones of said tabs such that, when said tabs are engaged by said electrical contacts forming said first and second coupling means, selected pins/sockets of said input connector are electrically connected to selected pins/sockets of said output connector.

7. A programmable cable adaptor as recited in claim 6 wherein at least some of said tabs are electrically interconnected through an electrical component.

8. A programmable cable adaptor as recited in claim 1 wherein said first plurality of coupling means includes discrete light sources, said second plurality of coupling means includes discrete light detector means, and said discrete communicating elements include a plurality of light conductors configured to optically link selected ones of said light sources to selected ones of said light detectors.

9. A programmable cable adaptor as recited in claim 8 wherein some of said input pins/sockets are directly connected to some of said output pins/sockets.

10. A programmable cable adaptor as recited in claim 8 wherein some of said input pins/sockets are directly connected to some of said output pins/sockets and to some of said coupling means.

11. A programmable cable adaptor as recited in claim 1 wherein at least one of said input and output connector means is a J1962 connector.

12. A programmable cable adaptor as recited in claim 1 wherein at least one of said input and output connector means is a DB15 connector.

13. A programmable cable adaptor as recited in claim 1 wherein said first plurality of coupling means includes light sources, and said second plurality of coupling means include light detectors, and wherein said communicating elements form light conducting paths between selected ones of said light sources and selected ones of said light detectors.

14. A programmable cable adaptor comprising:
   means forming a housing;
   circuit board means disposed within said housing and including a plurality of electrically conductive traces;
   an input connector means having a plurality of input pins/sockets electrically coupled to a first set of said traces;
   an output connector means having a plurality of output pins/sockets electrically coupled to a second set of said traces;
   key receptacle means having a key-receiving aperture and a first plurality of coupling means disposed along at least one side of said aperture and connected by said first set of traces to said input pins/sockets and a second plurality of coupling means disposed alongside said aperture and connected by said second set of traces to said output pins/sockets; and
   key means having a plurality of discrete communicating elements configured to link selected ones of said first coupling means to selected ones of said second coupling means such that selected output pins/sockets are communicatively connected to selected input pins/sockets when said key means is disposed within said aperture.

15. A programmable cable adaptor as recited in claim 14 wherein some of said input pins/sockets are directly connected to some of said output pins/sockets.

16. A programmable cable adaptor as recited in claim 14 wherein some of said input pins/sockets are directly connected to some of said output pins/sockets and to some of said coupling means.

17. A programmable cable adaptor as recited in claim 14 wherein said first and second coupling means include electrical contacts, and wherein said key means includes a plurality of conductive tabs disposed along both sides of a programming card with particular ones of said tabs electrically connected to other ones of said tabs such that, when said tabs are engaged by said electrical contacts forming said first and second coupling means, selected pins/sockets of said input connector are electrically connected to selected pins/sockets of said output connector.

18. A programmable cable adaptor as recited in claim 17 wherein at least some of said tabs are electrically interconnected through an electrical component.

19. A programmable cable adaptor as recited in claim 14 wherein said first plurality of coupling means includes discrete light sources, said second plurality of coupling means includes discrete light detector means, and said discrete communicating elements include a plurality of light conductors configured to optically link selected ones of said light sources to selected ones of said light detectors.

20. A programmable cable adaptor as recited in claim 19 wherein some of said input pins/sockets are directly connected to some of said output pins/sockets.

21. A programmable cable adaptor as recited in claim 19 wherein some of said input pins/sockets are directly connected to some of said output pins/sockets and to some of said coupling means.

22. A programmable cable adaptor as recited in claim 14 wherein some of said input pins/sockets are connected to other input pins/sockets and some of said output pins/sockets are connected to other output pins/sockets.

23. A programmable cable adaptor as recited in claim 14 wherein said key means includes means for enabling an electronic system connected to said adaptor to determine the key type thereof.

24. A programmable cable adaptor as recited in claim 14 wherein at least one of said input and output connector means is a J1962 connector.

25. A programmable cable adaptor as recited in claim 14 wherein at least one of said input and output connector means is a DB152 connector.

26. A programmable cable adaptor as recited in claim 14 wherein said first plurality of coupling means includes light sources, and said second plurality of coupling means include light detectors, and wherein said communicating elements form light conducting paths between selected ones of said light sources and selected ones of said light detectors.

* * * * *

REEXAMINATION CERTIFICATE (3052th)

United States Patent [19]
Kreft et al.

[11] B1 5,442,170
[45] Certificate Issued Nov. 5, 1996

[54] PROGRAMMABLE CABLE ADAPTOR FOR CONNECTING DIFFERENT AUTOMOBILE COMPUTERS TO DIAGNOSTIC EQUIPMENT

[75] Inventors: Keith A. Kreft, Cupertino; Karl F. Heinrich, San Jose, both of Calif.

[73] Assignee: Snap-On Technologies, Inc., Crystal Lake, Ill.

Reexamination Request:
No. 90/004,057, Dec. 13, 1995

Reexamination Certificate for:
Patent No.: 5,442,170
Issued: Aug. 15, 1995
Appl. No.: 228,445
Filed: Apr. 15, 1994

[51] Int. Cl.$^6$ .................................................. G01D 5/34
[52] U.S. Cl. ................... 250/229; 250/227.11; 385/15; 439/638
[58] Field of Search ..................... 250/229, 227.11; 340/825.05; 324/378, 73.1; 364/424.01, 424.03; 385/15, 17; 395/200, 295; 439/76, 928, 638, 654, 189

[56] References Cited

U.S. PATENT DOCUMENTS

| | | | |
|---|---|---|---|
| 4,039,902 | 8/1977 | Lacan et al. | 361/395 |
| 4,090,766 | 5/1978 | Buhr et al. | |
| 4,384,755 | 5/1983 | Perretta | 339/18 R |
| 4,420,794 | 12/1983 | Anderson . | |
| 4,480,835 | 11/1984 | Williams | 273/148 B |
| 4,490,775 | 12/1984 | Quan | 361/406 |
| 4,525,018 | 6/1985 | Holce | 339/91 R |
| 4,551,801 | 11/1985 | Sokol | 364/424 |
| 4,567,756 | 2/1986 | Colborn | 73/118 |
| 4,578,573 | 3/1986 | Flies et al. . | |
| 4,588,187 | 5/1986 | Dell | 273/1 E |
| 4,631,698 | 12/1986 | Walsh et al. | 364/900 |
| 4,679,728 | 7/1987 | Gregory | 237/1 R |

(List continued on next page.)

FOREIGN PATENT DOCUMENTS 62-293719 5/1989 Japan .
62-299600 6/1989 Japan .

OTHER PUBLICATIONS

International Search Report for PCT/US95/05996.
VATS Interrogator Brochure Pages.
"The Best Automotive Speciality & Hard-to-Find Tools" Brochure Pages.
Seeburg Corporation Phonograph Installation & Operation Manual, 1972.
J34914, J35616, J35592 & J35628 Page.
"What OBD II Means to You," OTC Div SPX Corporation, *Motor* Nov., 1992.

(List continued on next page.)

*Primary Examiner*—Stephone B. Allen

[57] ABSTRACT

A programmable cable adaptor in accordance with the present invention includes a housing containing an internal circuit board having a plurality of conductive traces, an input connector with multiple pins or pin-receiving sockets, and an output connector with multiple pins or pin-receiving sockets. On the circuit board, there is a card edge receptacle with key-contacting pins electrically connected to the conductive traces which in turn electrically couple the receptacle pins to the input connector and/or the output connector. The key-contacting pins of the card edge receptacle are arrayed along at least one side of an elongated aperture adapted to receive an adaptor programming key generally referred to as a card edge key The "key" is typically a small printed circuit board with conductive tabs on at least one side thereof with each tab being electrically connected to at least one other tab on the key with conductive traces. When the key is inserted in the receptacle aperture, electrical connections are made between the pins/sockets of the input connector and the pins/sockets of the output connector via the tabs and circuit traces on the key. Some of the pins/sockets of the input connector may be directly connected to the pins of the output connector without going through the card edge receptacle.

U.S. PATENT DOCUMENTS

| | | | |
|---|---|---|---|
| 4,690,475 | 9/1987 | McElroy | 439/502 |
| 4,694,408 | 9/1987 | Zaleski | 364/551 |
| 4,757,463 | 7/1988 | Ballou et al. | 364/551 |
| 4,796,206 | 1/1989 | Boscove et al. | 364/551.01 |
| 4,831,560 | 5/1989 | Zaleski | 364/551.01 |
| 4,853,850 | 8/1989 | Krass, Jr. et al. | 364/200 |
| 4,862,371 | 8/1989 | Maekawa . | |
| 4,865,561 | 9/1989 | Collier | 439/391 |
| 4,897,055 | 1/1990 | Jurista et al. | 439/924 |
| 4,964,124 | 10/1990 | Burnett | 371/15.1 |
| 4,998,183 | 3/1991 | Chiang | 361/395 |
| 5,003,477 | 3/1991 | Abe et al. . | |
| 5,007,888 | 4/1991 | Goutiere . | |
| 5,040,990 | 8/1991 | Suman et al. . | |
| 5,072,185 | 12/1991 | Rockwell | 324/539 |
| 5,130,893 | 7/1992 | Straate et al. | 361/392 |
| 5,177,447 | 1/1993 | Marino et al. | 324/713 |
| 5,214,582 | 5/1993 | Gray | 364/424.03 |
| 5,315,252 | 5/1994 | Puetz et al. . | |
| 5,320,561 | 6/1994 | Cook | 439/500 |
| 5,327,343 | 7/1994 | Forchert | 364/424.01 |

OTHER PUBLICATIONS

"Surface Vehicle Recommended Practice," Society of Automotive Engineers, Inc., 1994.

"When you're Faced with the OBD II Challenge, OTC has the Solution," Monitor Memo OTC Document, May, 1993.

"Scan Tool Shoot Out Report," Monitor Memo OTC Document, May, 1993.

"What OBD II Means to you," OTC Div SPX Corporation, Automotive Repair Industry Trade Expo, Oct. 17, 1993.

"Five U.S. Firms to Work on Circuits for Toyota," *Electronic News*, Jul. 9, 1990.

*RS-232 Made Easy—Connecting Computers, Printers, Terminals and Modems*, Martin D. Seyer (American Bell, Inc.), Prentice Hall, 1984, pp. 77–89.

"OBD II" Diagnose, Summer, 1993.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

ONLY THOSE PARAGRAPHS OF THE SPECIFICATION AFFECTED BY AMENDMENT ARE PRINTED HEREIN.

Column 4, lines 8–28:

Referring now to FIG. 3, which is intended to illustrate the internal interconnections between the several connectors, the card edge connector 16 is shown to have twelve pins [20] 22 on one side, which are connected by traces 19, formed on a circuit board suggested by the dashed lines 17, to the pins [22] 20 of the input connector 12. Similarly, twelve pins 24 on the opposite side of connector 16 are connected by circuit board traces 25 to the pin receptacles 26 of the output connector 14. The connectors 12 and 14 are also attached to the circuit board 17. Optionally, some of the pins of the input connector 12 may be connected by circuit board traces 27 directly to the pins of the output connector 14 or to both the pins of the output connector 14 and to pins on the other side of card edge connector 16. *In another option (not shown), some of the input pins may be connected to other input pins, and some of the output pins may be connected to other output pins.* The card contacting surfaces 23 of the pins 22 and 24 of the edge connector may be simple conductive bumps, leaf spring contacts, spring-loaded pins or other suitable means. Furthermore, instead of using circuit board traces, discrete wires or ribbon cable conductors could be used to interconnect the general connectors.

AS A RESULT OF REEXAMINATION, IT HAS BEEN DETERMINED THAT:

The patentability of claims 1–24 and 26 is confirmed.

Claim 25 is determined to be patentable as amended.

New claims 27–48 are added and determined to be patentable.

25. A programmable cable adaptor as recited in claim 14 wherein at least one of said input and output connector means is a [DB152] *DB15* connector.

*27. A programmable cable adaptor comprising:*

*an input connector having a plurality of input pins/sockets;*

*an output connector having a plurality of output pins/sockets;*

*a key receptacle having a key-receiving aperture and a plurality of first coupling means disposed along at least one side of said aperture and electrically connected to at least some of said input pins/sockets, and a plurality of second coupling means disposed along at least one side of said aperture and connected to at least some of said output pins/sockets; and*

*a plurality of distinct keys, each key being insertable into said key receptacle, each key having a plurality of respectively-arranged discrete communicating elements configured to link selected ones of said first coupling means to selected ones of said second coupling means such that selected output pins/sockets are communicatively connected to selected input pins/sockets when said key is disposed within said key-receiving aperture,*

*wherein each key corresponds to a respective set of connections between the input connector and the output connector, so that said cable adaptor can be configured in a plurality of different ways corresponding in number to the number of keys.*

*28. The programmable cable adaptor of claim 27 wherein said output pins/sockets that are communicatively coupled to said input pins/sockets when a said key is inserted in said key-receiving aperture, are not so communicatively coupled when no key is inserted in said key-receiving aperture.*

*29. The programmable cable adaptor of claim 28 wherein some of said input pins/sockets are directly connected to some of said output pin/sockets and are not communicatively coupled through said key.*

*30. The programmable cable adaptor of claim 27 wherein said first and second coupling means include electrical contacts, and wherein each said key includes a plurality of conductive tabs disposed along both sides of a programming card with particular ones of said tabs respectively electrically connected to other ones of said tabs such that, when said key is inserted in said key receptacle, said tabs are engaged by said electrical contacts forming said first and second coupling means and selected pins/sockets of said input connector are electrically connected to selected pins/sockets of said output connector in a combination corresponding to the key so that a plurality of different combinations can be obtained, corresponding in number to the number of said keys.*

*31. A programmable cable adaptor comprising:*

*an input connector having a plurality of input pins/sockets;*

*an output connector having a plurality of output pins/sockets;*

*a key receptacle having a key receiving aperture and a plurality of first coupling means disposed along at least one side of said aperture and electrically connected to at least some of said input pins/sockets, and a plurality of second coupling means disposed along at least one side of said aperture and connected to at least some of said output pins/sockets; and*

*a key, insertable into said key receptacle, and having a plurality of discrete communication elements configured to link selected ones of said first coupling means to selected ones of said second coupling means such that selected output pins/sockets are communicatively connected to selected input pins/sockets only when said key is disposed within said aperture,*

*wherein said output pins/sockets that are communicatively coupled to said input pins/sockets, when said key is inserted in said key-receiving aperture, are not communicatively coupled to an input pins/sockets when said key is not inserted in said key-receiving aperture.*

*32. The programmable cable adaptor of claim 31 wherein said key comprises a plurality of keys, each having a respective plurality of discrete communication elements configured to link selected ones of said first coupling means to selected ones of said second coupling means such that selected output pins/sockets are communicatively connected to selected input pins/sockets when a said key is disposed within said aperture,* wherein each key corresponds to a respective set of connections between the input connector and the output connector, so that said cable adaptor can be configured in a plurality of different combinations.

33. The programmable cable adaptor of claim 31 wherein said input connector and said output connector are configured so that signals developed in an automotive engine may be coupled to a diagnostic device via a cable communicating with said key receptacle.

34. The programmable cable adaptor of claim 31 wherein some of said input pins/sockets are directly connected to some of said output pins/sockets and are not communicatively coupled through said key.

35. The programmable cable adaptor of claim 32 wherein said first and second coupling means include electrical contacts, and wherein each said key includes a plurality of conductive tabs disposed along both sides of a programming card with particular ones of said tabs respectively electrically connected to other ones of said tabs such that, when said key is inserted in said key receptacle, said tabs are engaged by said electrical contacts forming said first and second coupling means and selected pins/sockets of said input connector are electrically connected to selected pins/sockets of said output connector in a combination corresponding to the key so that a plurality of different combinations can be obtained, corresponding in number to the number of said keys.

36. A programmable cable adaptor comprising:

an input connector having a plurality of input pins/sockets;

an output connector having a plurality of output pins/sockets;

a key receptacle having a key-receiving aperture and a plurality of first coupling means disposed along at least one side of said aperture and electrically connected to at least some of said input pins/sockets, and a plurality of second coupling means disposed along at least one side of said aperture and connected to at least some of said output pins/sockets, said key receptacle causing a normally open circuit condition to exist between said some of said input pins/sockets and said some of said output pins/sockets; and a key having a plurality of discrete communicating elements configured to link selected ones of said first coupling means to selected ones of said second coupling means such that selected output pins/sockets are communicatively connected to selected input pins/sockets when said key is disposed within said aperture and are communicatively disconnected when the key is not disposed in said aperture.

37. The programmable cable adaptor of claim 36 wherein said key comprises a plurality of keys, each having a respective plurality of discrete communication elements configured to link selected ones of said first coupling means to selected ones of said second coupling means such that selected output pins/sockets are communicatively connected to selected input pins/sockets when said key is disposed within said aperture, wherein each key corresponds to a respective set of connections between the input connector and the output connector, so that said cable adaptor can be configured in a plurality of different combinations.

38. A programmable cable adaptor comprising:

means forming a housing;

a circuit board disposed within said housing and including a plurality of electrically conductive traces;

an input connector having a plurality of input pins/sockets electrically coupled to a first set of said traces;

an output connector having a plurality of output pins/sockets electrically coupled to a second set of said traces;

a key receptacle having a key-receiving aperture and a plurality of first coupling means disposed along at least one side of said aperture and connected by said first set of traces to said input pins/sockets and a plurality of second coupling means disposed alongside said aperture and connected by said second set of traces to said output pins/sockets, said key receptacle causing a normally open circuit condition to exist between said input pins/sockets and said output pins/sockets; and a key having a plurality of discrete communicating elements configured to link selected ones of said first coupling means to selected ones of said second coupling means such that selected output pins/sockets are communicatively connected to selected input pins/sockets when said key is disposed within said aperture and are disconnected when said key is not disposed within said aperture.

39. The programmable cable adaptor to claim 38 wherein said key comprises a plurality of keys, each having a respective plurality of discrete communication elements configured to link selected ones of said first coupling means to selected ones of said second coupling means such that selected output pins/sockets are communicatively connected to selected input pins/sockets when said key is disposed within said aperture, wherein each key corresponds to a respective set of connections between the input connector and the output connector, so that said cable adaptor can be configured in a plurality of different combinations.

40. The programmable cable adaptor of claim 1 wherein said input connector means has a different number of pins/sockets than said output connector means.

41. The programamble cable adaptor of claim 1 wherein one of said input and output connector means is an automotive connector and said other connector means is an electrical connector.

42. The programmable cable adaptor of claim 14 wherein said input connector means has a different number of pins/sockets than said output connector means.

43. The programmable cable adaptor of claim 14 wherein one of said input and output connector means is an automotive connector and said other connector means is an electrical connector.

44. The programmable cable adaptor of claim 27 wherein one of said input connector and said output connector is configured to be connected to an automotive on-board electronic system and said other connector is configured to be connected to a piece of diagnostic system.

45. The programmable cable adaptor of claim 44 wherein more than one key can be used to form respective connections between said piece of diagnostic equipment and said automotive on-board electronic system so that different systems on-board a single motor vehicle can be successively tested.

46. The programmable cable adaptor of claim 31 wherein one of said input connector and said output connector is configured to be connected to an automotive on-board electronic system and said other connector is configured to be connected to a piece of diagnostic system.

47. The programmable cable adaptor of claim 36 wherein one of said input connector and said output connector is configured to be connected to an automotive on-board electronic system and said other connector is configured to be connected to a piece of diagnostic system.

48. The programmable cable adaptor of claim 38 wherein one of said input connector and said output connector is configured to be connected to an automotive on-board electronic system and said other connector is configured to be connected to a piece of diagnostic system.

* * * * *